US 6,568,551 B2

(12) United States Patent
Grossenbacher

(10) Patent No.: US 6,568,551 B2
(45) Date of Patent: May 27, 2003

(54) ACTUATING DRIVE WITH A HOUSING WITH SEALING MEANS

(75) Inventor: Christian Grossenbacher, Waltenschwil (CH)

(73) Assignee: Siemens Building Technologies AG (CH)

( * ) Notice: Subject to any disclaimer, the term of this patent is extended or adjusted under 35 U.S.C. 154(b) by 61 days.

(21) Appl. No.: 10/000,521

(22) Filed: Nov. 2, 2001

(65) Prior Publication Data

US 2002/0084272 A1 Jul. 4, 2002

(30) Foreign Application Priority Data

Dec. 13, 2000 (EP) .............................. 00127331

(51) Int. Cl.$^7$ ............................... B65D 41/16
(52) U.S. Cl. ................ 220/4.02; 220/4.21; 220/783
(58) Field of Search .................. 220/4.02, 4.21, 220/783

(56) References Cited

U.S. PATENT DOCUMENTS

| | | | | |
|---|---|---|---|---|
| 5,097,977 A | * | 3/1992 | Straub | 220/783 |
| 5,310,075 A | * | 5/1994 | Wyler | 220/4.02 |
| 5,875,918 A | * | 3/1999 | Sheffler et al. | 220/783 |
| 6,029,807 A | * | 2/2000 | Love | 206/82 |
| 6,196,404 B1 | * | 3/2001 | Chen | 220/4.21 |

FOREIGN PATENT DOCUMENTS

| | | |
|---|---|---|
| DE | 39 27 528 | 2/1991 |
| EP | 0 777 407 | 6/1997 |
| EP | 0 798 564 | 10/1997 |
| FR | 2762660 | 10/1998 |
| GB | 975059 | 11/1964 |

OTHER PUBLICATIONS

Open Air™ Stellantriebe fur Luftklappen, Siemens Building Technologies, specification CM2N4613D.

* cited by examiner

Primary Examiner—Joseph M. Moy
(74) Attorney, Agent, or Firm—Greer, Burns & Crain, Ltd.

(57) ABSTRACT

An actuating drive (1) has a housing (4) which also affords protection from splashed water and which comprises two housing portions (5; 6), wherein the two housing portions (5; 6) each have an edge (20; 40) with a respective end face (21; 41) which are disposed in opposite relationship when the housing portions are assembled. When the two housing portions (5; 6) are assembled zones which act in different ways are formed between the two end faces (21; 41). A first zone (Z1) in which the two housing portions (5; 6) are in contact with each other is provided on the housing (4) towards the exterior. A second zone (Z2) having a passage (55) is provided beside the first zone (Z1), towards the interior. The passage (55) of the second zone (Z2) is closed towards an internal space (33) of the housing by a third zone (Z3) in which the two housing portions (5; 6) are not in contact with each other. The spacing (a) between the two housing portions (5; 6) in the third zone (Z3) is such that any water present in the second zone (Z2), because of surface tension effects, cannot flow away beyond the third zone into the internal space (33) of the housing.

6 Claims, 4 Drawing Sheets

ACTUATING DRIVE WITH A HOUSING WITH SEALING MEANS

BACKGROUND OF THE INVENTION

1. Field of the Invention

The invention relates to an actuating drive.

Such actuating drives are advantageously used in the heating, ventilating and air-conditioning art for the actuation of control members such as ventilation flaps, valves and the like.

2. Description of the Prior Art

A housing for an actuating drive of that kind must protect electromechanical and electronic components of the actuating drive from fouling and splashed water and in that respect must also comply with certain standards.

An actuating drive is known for example from the data specification sheet CM2N4613D from Siemens Building Technologies.

Further housings which can protect electromechanical or electronic components or units from contamination or splashed water have been proposed for example in DE 39 27 528 A, GB 975 059 A or EP 777 407 A.

The known housings however suffer from the disadvantage that, to achieve the required sealing integrity, they have additional sealing elements such as sealing rings, cords or strips which are fitted in appropriate grooves in the housings. It is also known for joints of a housing to be sealed off with pastes of various kinds. Known means for affording sealing integrity however involve at least one of the disadvantages listed below:

The sealing element ages and has to be replaced.

The sealing element has to be precisely adapted to the shape of the housing portion and carefully placed.

The sealing element has to be replaced after the housing has been opened.

The housing is gas-tightly closed by the sealing element so that condensation water can form in the interior of the housing, which no longer guarantees the required reliability and security of the actuating drive.

SUMMARY OF THE INVENTION

The object of the invention is to propose for an actuating drive a housing with sealing means, in which at least some of the above-listed disadvantages do not occur.

In accordance with the invention, there is provided an actuating drive comprising a housing which has a first housing portion and a second housing portion, wherein:

the two housing portions each have a respective edge with a respective end face and the two end faces are in mutually opposite relationship when the two housing portions are assembled;

the first housing portion and the second housing portion can be releasably and directly assembled together;

when the two housing portions are assembled, first, second and third zones which act in different ways are formed between the two end faces;

the first zone in which the two housing portions are in contact with each other is formed on the housing towards the exterior;

the second zone has a passage and is formed beside the first zone towards the interior; and the passage of the second zone in the housing is closed towards an internal space of the housing by the third zone in which the two housing portions are not in contact with each other, and the spacing between the two housing portions in the third zone is such that any water present in the second zone, by virtue of surface tension effects, cannot flow beyond the third zone into the internal space of the housing.

Advantageous features are set forth in the dependent claims.

BRIEF DESCRIPTION OF THE DRAWINGS

Embodiments of the invention are described in greater detail hereinafter with reference to the drawings in which.

DESCRIPTION OF THE PREFERRED EMBODIMENTS

Figure 1:
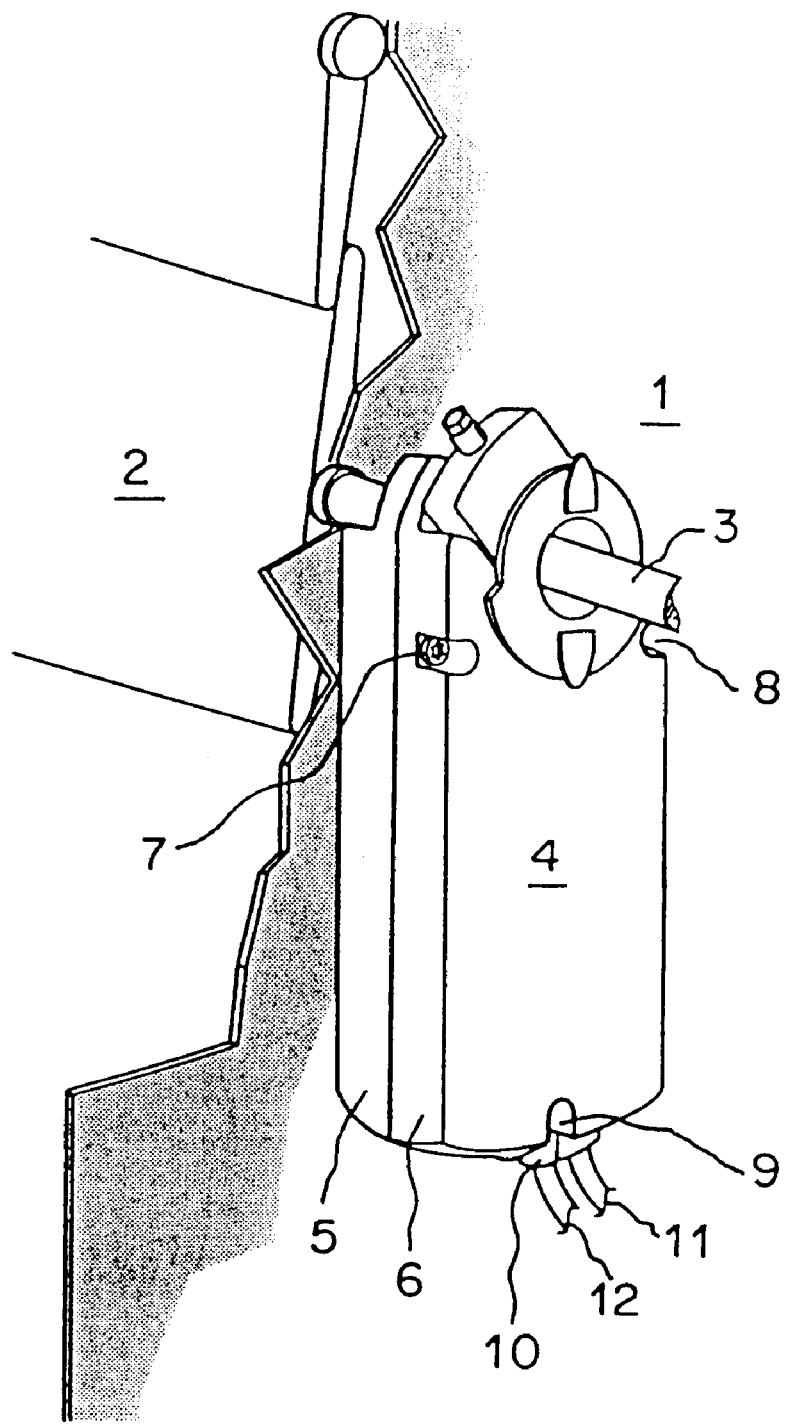
FIG. 1 shows an actuating drive with a housing with sealing means.

Referring to FIG. 1, reference 1 therein denotes an actuating drive for actuating a control member 2. The control member 2—in the illustrated example a ventilation flap—is actuatable by way of a rotatable spindle 3. The actuating drive has a housing 4 with a first housing portion 5 and a second housing portion 6. The two housing portions 5 and 6 are advantageously releasably connected by screws 7, 8 and 9. The actuating drive 1 has a feed means 10 for connections 11 and 12. The connections 11 and 12 serve for communication and/or supply. Typically the connections 11 and 12 are for an electrical actuating signal. If necessary the feed means 10 has further connections—for example for positional feedback or for energy supply.

The geometry and functionality of the housing 4 are advantageously adapted on the one hand to electronic, electrical and mechanical components and units of the actuating drive 1, which are to be protected, and on the other hand to the arrangement of the actuating drive 1 on the control member 2, in which respect in particular an inexpensive but reliable and properly operational assembly is important.

Figure 2:
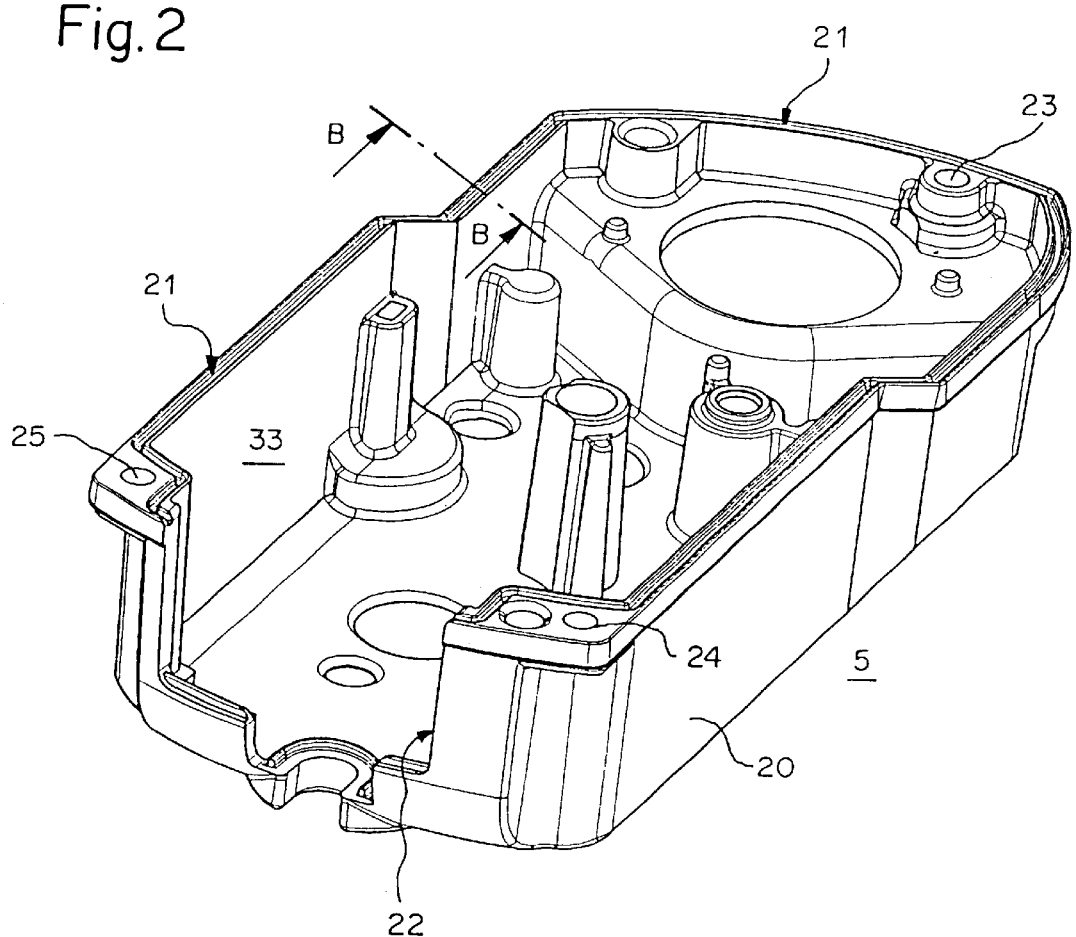
FIG. 2 shows a first housing portion with an edge.

FIG. 2 shows by way of example an embodiment of the first housing portion 1, which in principle is in the form of a shell portion. The first housing portion 5 has a raised edge 20 with an end face 21, by which the first housing portion 5 is substantially delimited. Advantageously, the raised edge 20 has a recess 22 for the feed means 10 (FIG. 1).

The first housing portion 5 advantageously has holes 23, 24, 25 for the screws 7, 8 and 9 (FIG. 1).

In an advantageous embodiment of the first housing portion 5 the edge 20, in the region of the end face 21, has a groove 30 between ribs 31 and 32 (FIG. 3), wherein a first rib 31 adjoins an internal space or cavity 33 of the housing (see FIG. 2) and a second rib 32 is disposed on the housing 4 (FIG. 1) towards the exterior.

Figure 4:
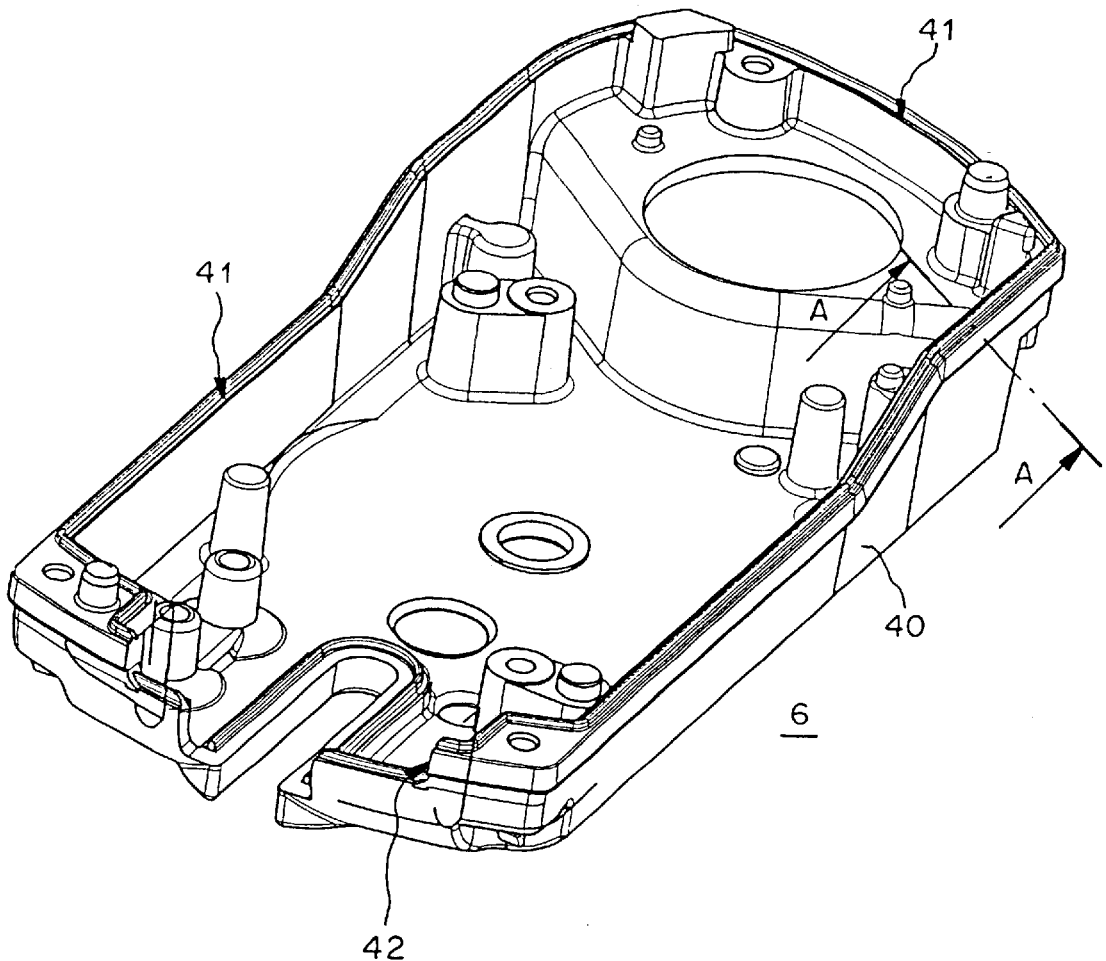
FIG. 4 shows a second housing portion with an edge.

FIG. 4 shows by way of example an embodiment of the second housing portion 6, which in principle is in the form of a cover. The second housing portion 6 has a raised edge 40 with an end face 41, by which the second housing portion 6 is substantially delimited. The raised edge 40 also advantageously has a recess 42 for the feed means 10 (FIG. 1).

The second housing portion 6 advantageously has holes 43, 44, 45 for the screws 7, 8 and 9 (FIG. 1).

Figure 3:
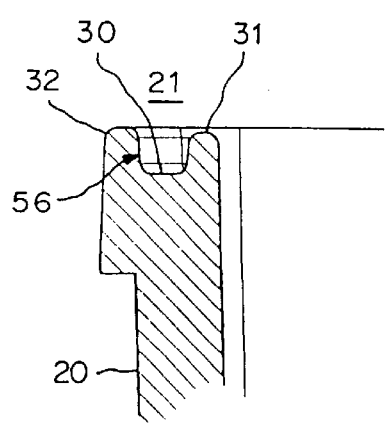
FIG. 3 is a sectional view B—B of the edge of the first housing portion shown in FIG. 2.
Figure 5:
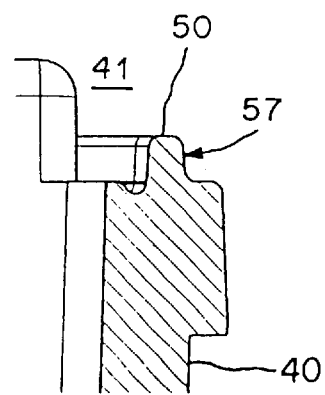
FIG. 5 shows a sectional view A—A of the edge of the second housing portion shown in FIG. 4.

In an advantageous embodiment of the second housing portion 6, in the region of the end face 41 the edge 40 has a bead or ridge 50 (FIG. 5) in the form of a counterpart to the groove 30 (FIG. 3).

Figure 6:
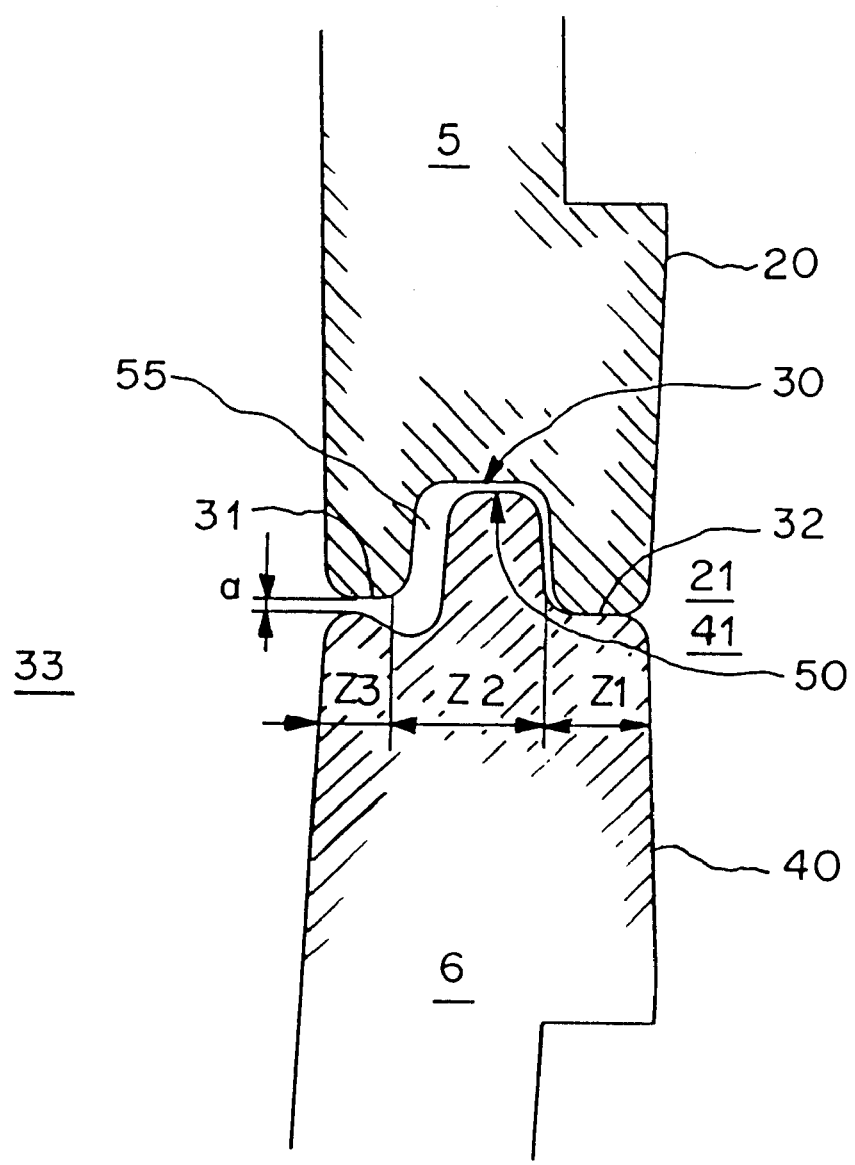
FIG. 6 shows a sectional view of a detail of the two assembled housing portions.

The housing 4 has a sealing means in accordance with the invention when the two housing portions 5 and 6 are assembled in such a way that the two end faces 21 and 41 are in mutually opposite relationship (see FIG. 6), wherein the first housing portion 5 and the second housing portion 6 are laid one upon the other releasably and directly—that is to say without an additional sealing element. The two end faces 21 and 41 are of such configurations that, when the two housing portions 5 and 6 are assembled, essentially three zones which act in different ways are formed between the two end faces 21 and 41. A first zone Z1 is formed on the housing 4, towards the exterior thereof, being a zone in which the two housing portions 5 and 6 are in contact with each other. A second zone Z2 having a passage 55 is formed beside the first zone Z1, towards the interior. The passage 55 of the second zone Z2 is closed off towards the internal space 33 of the housing by a third zone Z3 in which the two housing portions 5 and 6 are not in contact with each other, wherein the spacing a between the two housing portions 5 and 6 in the third zone Z3 is of such a size that water which is possibly present in the passage 55 of the second zone Z2, because of surface tension effects, cannot flow away beyond the third zone Z3 into the internal space 33 of the housing.

Although the two housing portions 5 and 6 are in contact with each other in the first zone Z1, the housing 4 is not gas-tightly closed in the zone Z1. That has the advantage that any gases which may be present and in particular water vapor may escape from the internal space 33 of the housing so that the risk of condensation water being deposited in the internal space 33 of the housing is reduced and the housing nonetheless affords effective protection from splashed water and fouling.

So that a good fit is achieved between the two housing portions 5 and 6 and mutual displacement along the edges 20 or 40 is prevented, the shapes of the two end faces 21 and 41 are so matched to each other that a mutual abutment is advantageously formed in the transitional region between the first zone Z1 and the second zone Z2.

Mutual positioning of the two housing portions 5 and 6 is advantageously determined in particular by a side wall 56 (see FIG. 3) of the groove 30, adjoining the first zone Z1, and a further side wall 57 (see FIG. 5) of the bead 50, adjoining the first zone Z1.

The two housing portions 5 and 6 are advantageously connected together by a plurality of screws 7, 8 and 9.

The housing 4 is advantageously produced by casting a light metal alloy, for example by die casting an aluminum alloy.

So that when using light metal die casting water which is possibly present in the passage 55 of the second zone Z2 cannot flow away beyond the third zone Z3 into the internal space 33 of the housing, the two edges 20 and 40 at the end faces 21 and 41 respectively are matched to each other in such a way that the minimum spacing a between the two housing portions 5 and 6 in the third zone Z3 is between 0.1 mm and 0.2 mm. In the case of aluminum die casting, the minimum spacing $\underline{a}$ is advantageously 0.15 mm.

I claim:

1. An actuating drive comprising a housing which has a first housing portion and a second housing portion, wherein:
   the two housing portions each have a respective edge with a respective end face and the two end faces are in mutually opposite relationship when the two housing portions are assembled;
   the first housing portion and the second housing portion can be releasably and directly assembled together;
   when the two housing portions are assembled, first, second and third zones which act in different ways are formed between the two end faces;
   the first zone in which the two housing portions are in contact with each other is formed on the housing towards the exterior;
   the second zone has a passage and is formed beside the first zone towards the interior; and
   the passage of the second zone in the housing is closed towards an internal space of the housing by the third zone in which the two housing portions are not in contact with each other, and the spacing between the two housing portions in the third zone is such that any water present in the second zone, by virtue of surface tension effects, cannot flow beyond the third zone into the internal space of the housing.

2. An actuating drive according to claim 1, wherein the shapes of the two end faces are so matched to each other that a mutual abutment is formed in a transitional region between the first zone and the second zone, by which mutual displacement of the two housing portions along the edges is prevented.

3. An actuating drive according to claim 1, wherein a groove is provided in the end face of the first housing portion in the region of the second zone and a bead is provided in the end face of the second housing portion as a counterpart to the groove, and mutual positioning of the two housing portions is determined by a wall of the groove adjoining the first zone and a wall of the bead adjoining the first zone.

4. An actuating drive according to claim 1, wherein the minimum spacing between the two housing portions in the third zone is between 0.1 mm and 0.2 mm.

5. An actuating drive according to claim 1, wherein the two housing portions are connected together by screws.

6. An actuating drive according to claim 1, wherein the two housing portions are made from light metal casting.

* * * * *